United States Patent [19]

Eumurian et al.

[11] 4,271,503
[45] Jun. 2, 1981

[54] AUTOMATIC CONTROL DEVICE FOR A RECEIVER USING A PILOT

[75] Inventors: Gregoire Eumurian; Jean-Pol Levan, both of Paris, France

[73] Assignee: Thomson-CSF, Paris, France

[21] Appl. No.: 960,779

[22] Filed: Nov. 15, 1978

[30] Foreign Application Priority Data

Nov. 15, 1977 [FR] France .................. 77 34240

[51] Int. Cl.³ .............................. H04J 1/02
[52] U.S. Cl. ........................ 370/74; 333/15; 455/234; 455/249; 455/619
[58] Field of Search .................. 250/199; 325/65, 411; 179/15 BP, 170.4; 333/15, 16; 370/74, 98; 455/68, 72, 234, 249, 619; 367/98; 375/98

[56] References Cited

U.S. PATENT DOCUMENTS

| | | | |
|---|---|---|---|
| 2,965,717 | 12/1960 | Bell | 333/16 |
| 3,328,716 | 6/1967 | Fish et al. | 333/15 |
| 3,483,334 | 12/1969 | Hermes | 333/16 |
| 3,804,995 | 4/1974 | Beckr | 333/16 |
| 4,009,350 | 2/1977 | Cabet et al. | 179/15 BP |
| 4,016,557 | 4/1977 | Zitelli et al. | 340/15.5 GC |
| 4,070,572 | 1/1978 | Summerhayes | 250/199 |

FOREIGN PATENT DOCUMENTS 665951 2/1952 United Kingdom .................. 333/15

*Primary Examiner*—Joseph A. Orsino, Jr.
*Attorney, Agent, or Firm*—Karl F. Ross

[57] ABSTRACT

Disclosed is a device for automatically controlling the gain of a receiving channel in a system comprising optical connections having a very wide pass band.

The useful signal of unknown level is transmitted with a pilot signal of known level through an optical connection, where it undergoes an attenuation, to a receiving assembly connected to an opto-electronic transducer at the output of the optical channel. A device for controlling the gain of the receiving channel commanded by the pilot signal digitally controls an attenuation circuit which thereupon restores the useful signal to its initial level.

5 Claims, 12 Drawing Figures

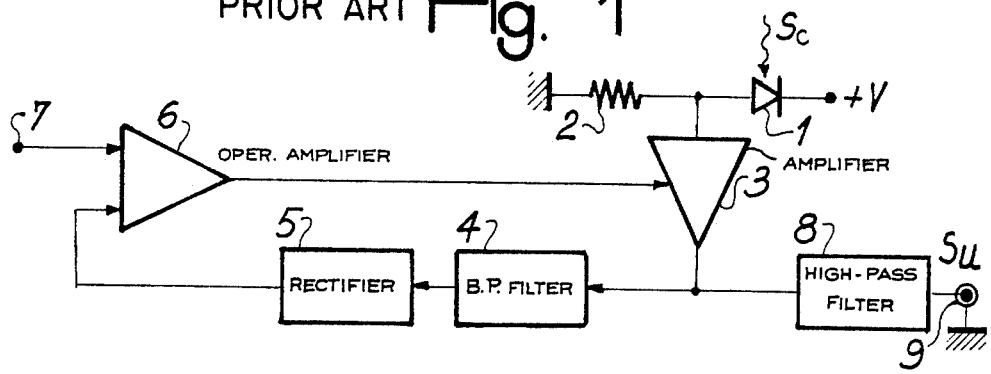
PRIOR ART Fig. 1
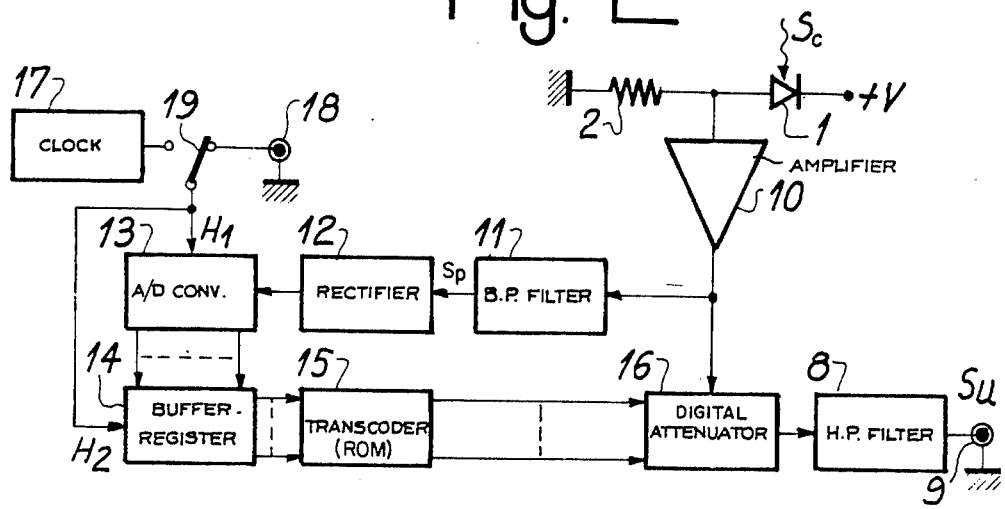
Fig. 2
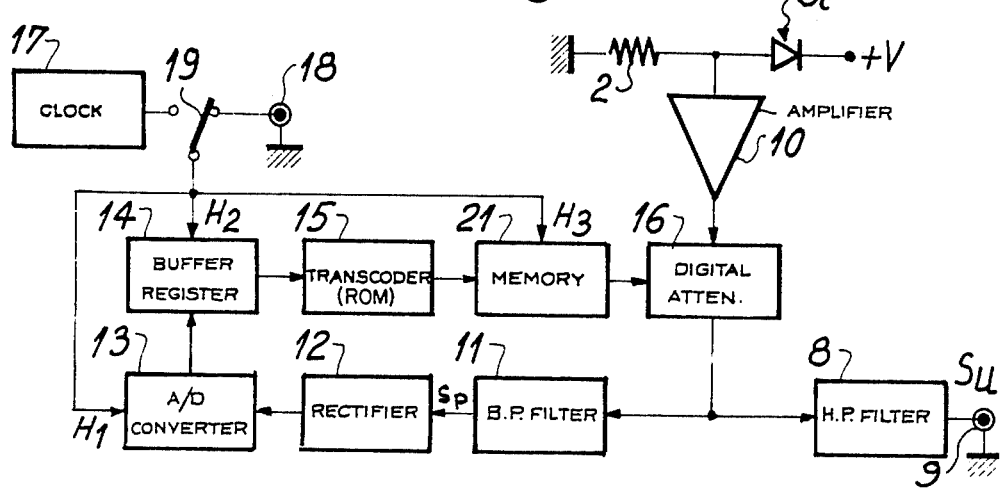
Fig. 3

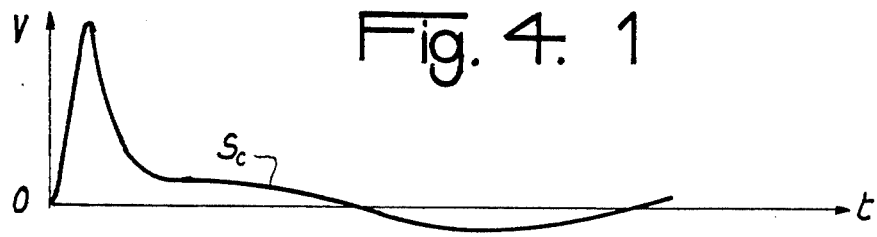
Fig. 4.1
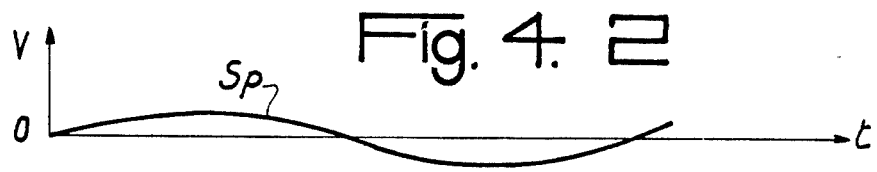
Fig. 4.2
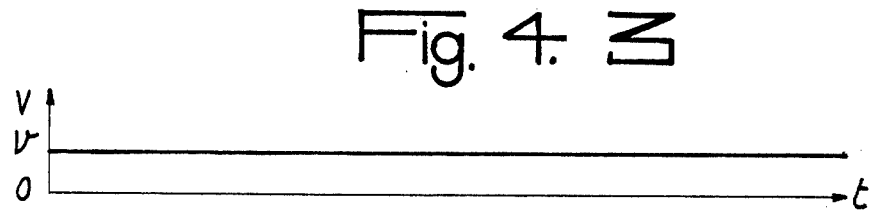
Fig. 4.3
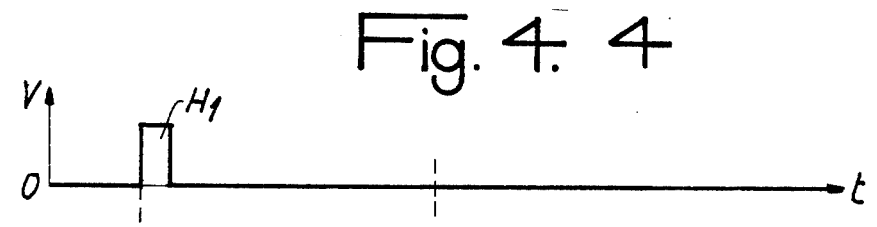
Fig. 4.4
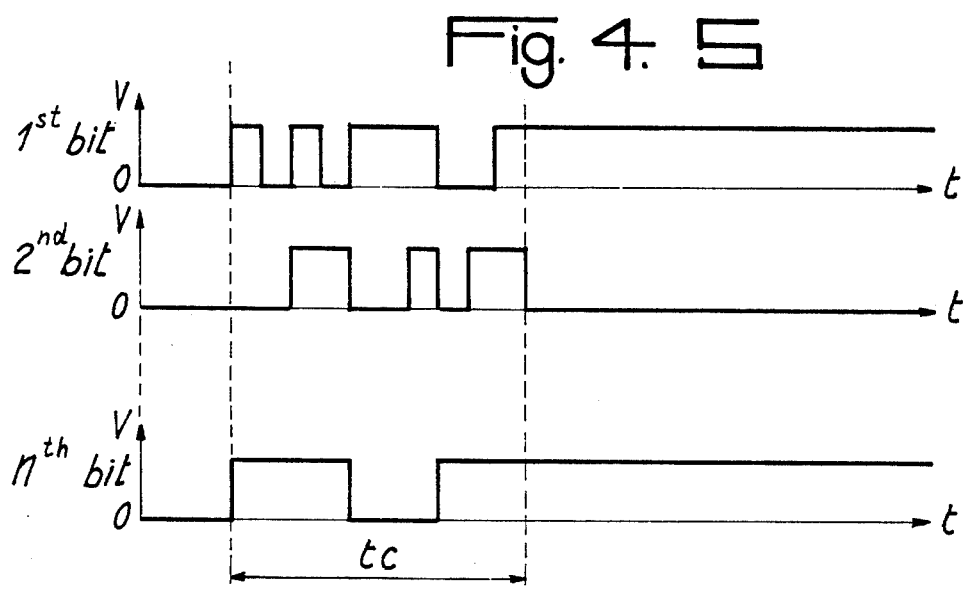
Fig. 4.5

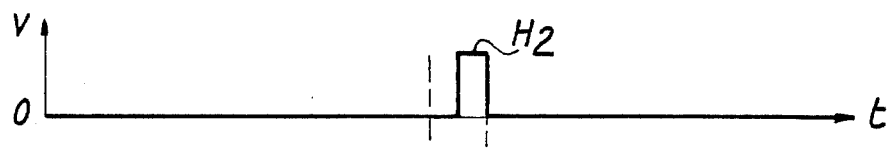
Fig. 4.6
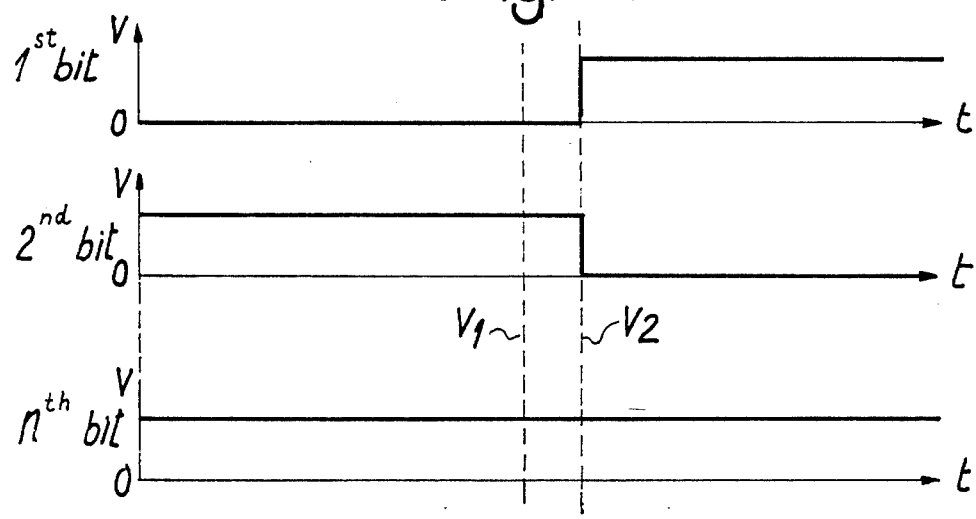
Fig. 4.7
Fig. 5
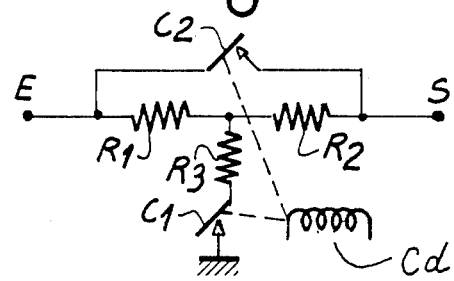
Fig. 6
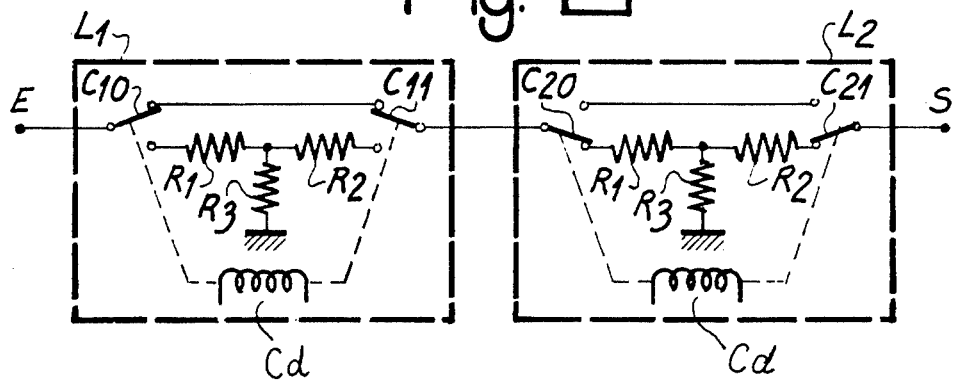

AUTOMATIC CONTROL DEVICE FOR A RECEIVER USING A PILOT

FIELD OF THE INVENTION

The present invention relates to a device for automatically controlling the gain of a receiving channel used in transmission systems handling high-frequency message signals.

BACKGROUND OF THE INVENTION

There are fields, mainly that known under the name of rapid electronics, in which there are to be processed, after having been detected and then transmitted, pulse-type signals of very short duration and also of low recurrence whose initial shape may be unknown but must nevertheless be rediscovered with a certain precision in the course of processing. This may be the case in the transmission of digital signals of around a hundred megabits having a very wide pass band of around, for example, 500 Mc/s.

In such transmissions, the detected signals are converted into optical signals by means of rapid optical emitters of the laser-diode and avalanche-photodiode type upon reception, allowing the establishment of wide-band connections which may reach about 100 MHz to 1 GHz. These optical connections are effected by optical fibers which, with respect to electrical connections, have the advantage of a galvanic insulation and a wide pass band. On the other hand, these connections by optical fibers have the drawback of subjecting the transmitted signals to an attenuation which may vary significantly in the course of the transmission. This is due to the fact that the optical connectors used are extremely sensitive to mechanical tolerances and to dust, and also to the fact that the optical fibers, which are usually of the multi-strand type, may include a variable number of broken strands which still further attenuate the transmission of light. In addition to these variations in level there are the variations produced by the emitting and receiving elements.

The emitting element is the transducer which receives from the detector the signal to be processed and converts it into an optical signal. Generally, this emitting element may be a solid laser or an electroluminescent diode which has a current/optical-power conversion rate variable with time. The optical receiver, detecting the signals transmitted through the fibers constituting the emitter-receiver optical connection, may employ two types of diodes, PIN or avalanche. The PIN diodes are stable with temperature and as a function of the biasing voltage. The avalanche photodiodes, whose sensitivity to light is about 100 times greater, are on the other hand very sensitive to variations in temperature and voltage.

This review of the drawbacks presented by the transmission systems employing optical connectors, as opposed to the advantages afforded by the use of such connections, indicates that care must be taken regarding the stability of the systems. In these systems, the emitter and receiver elements are usually stabilized by control loops. The variations in level which still exist then arise almost exclusively from the optical connections.

According to the prior art, where it is desired to know, with more or less precision depending on each case, the losses undergone by the signals in the optical connection so as to be able, by acting on the gain, to re-establish the level of the signal at the value it had at the input of the connection, there is superimposed on the signal to be processed, termed the useful signal, a pilot signal of predetermined and known level which is located outside the pass band of the useful signal. As the attenuations undergone by the pilot signal are identical to those undergone by the useful signal, the level of the useful signal may be re-established upon reception.

The pilot signal is extracted upon reception from the composite signal comprising the useful signal and the pilot signal and, after detection, controls a variable-gain device.

FIG. 1 shows, diagrammatically, such a device according to the prior art.

The useful signal, combined with the pilot signal after transmission in the optical connection considered to form an incoming signal Sc, is received at a photodiode 1 whose output is connected to an amplifier 3 comprising an attenuator. The output of this amplifier is connected, on the one hand, to the input 9 of the device (load) where the useful signal Su is collected, by way of a high-pass filter 8, and, on the other hand, to an assembly of circuits constituting a loop which is closed onto the amplifier 3. This loop comprises a band-pass filter 4 which isolates the pilot signal, a rectifier 5 without threshold which delivers the pilot signal of variable amplitude, and an operational amplifier 6 which receives the pilot signal issuing from the rectifier 5 and further receives a reference signal 7. The output signal of the amplifier 6 controls the gain of the amplifier. Photodiode 1 lies between positive supply voltage +V and ground in series with a resistor 2.

The automatic-gain-control circuitry applied to a transmission system with optical connection is realized in accordance with the prior art in an analog manner, employing PIN diodes, double-gate MOS transistors, etc. However, these analog realizations have the drawback of being limited as to pass band in the region of the low or the high frequencies, depending on the components used. They also have the drawback of producing distortions and above all of varying the frequency-response curve at the same time as the gain. Moreover, as the gain-control function is not linear, it is necessary to employ a closed loop to control the amplifier, which may present problems of stability in certain cases.

OBJECT OF THE INVENTION

The general object of our present invention is to define a device for automatically controlling the gain of a receiving channel, in the sense defined above, of a transmission system incorporating at least one optical connection, which avoids the aforementioned drawbacks of the prior art.

SUMMARY OF THE INVENTION

We realize this object, in accordance with our present invention, through the use of attenuation means digitally settable to provide different step-down factors, substantially complementing the degree of attenuation experienced during transmission, in response to binary words selected with the aid of a transcoder which receives bit combinations representing the digitized amplitudes of a pilot oscillation accompanying an incoming message signal. The attenuation means, which may include several resistance pads in cascade, can be inserted in the receiving channel either upstream or downstream of a junction between that channel and the input of a control circuit including a band-pass filter which extracts the pilot oscillation for digitization and transcoding. The control circuit may further include a buffer register which temporarily stores the digitized pilot amplitudes and is periodically stepped by clock pulses also timing the operation of an analog-digital converter ahead of that register.

The control device according to our invention has the advantage of being particularly adapted to operate at high speed and in the digital mode, permitting the use in the attenuation circuit of relays having a wide pass band compatible with that of the processed signals.

BRIEF DESCRIPTION OF THE DRAWING

Other advantages and features of the invention will become apparent from the following description given with reference to the accompanying drawings in which:

FIG. 1, already discussed, represents a conventional receiver of optical signals;

FIG. 2 is a block diagram of an automatic-gain-control device according to our invention acting on an attenuator connected downstream of a receiving channel;

FIG. 3 is a similar block diagram showing a modified automatic-gain-control device, connected to the output of the attenuator;

FIGS. 4.1 through 4.7 are graphs showing the signals at various points of the automatic-gain-control device embodying out invention;

FIG. 5 is a circuit diagram of an attenuating network employed in the device; and FIG. 6 is a circuit diagram representing a combination of attenuating networks.

SPECIFIC DESCRIPTION

As has already been explained above, signals of very short duration, thus requiring a very wide pass band, are advantageously transmitted by optical connections. The processing of these signals, however, requires the knowledge of their initial amplitude if not their shape and therefore the provision of means for restoring the initial level of these signals which may have undergone substantial losses in the course of their transmission through an optical connection generally formed by optical fibers.

It is known that the information to be transmitted on optical fibers may be encoded in different manner, in amplitude, in frequency, in digital mode, etc. In the case of an encoding in amplitude modulation, it is essential to know precisely the various losses undergone by the signals to re-establish the correct level at the receiving end, i.e. at the output of the optical connection and before the processing of the signal. In the case of frequency modulation or of digital transmission, the level must also be re-established though not necessarily with the precision required in the case of amplitude modulation.

It will be recalled that the useful signal of very short duration and of unknown level which will be transmitted through the optical connection to the processing system is first received by a detector which delivers it in the form of an electric signal modulating a transducer, for example an electroluminescent diode, which converts it into a luminous signal that is transmitted through the optical connection to a receiving transducer, for example a photodiode which again converts it into an electric signal. In order to let the receiver know the losses undergone by the signal during its optical transmission, there is superimposed thereon, before its emission, a pilot signal of known level lying outside the pass band of the useful signal. It is therefore a composite signal, formed from the useful signal and the pilot signal, which is optically transmitted and it is assumed that the attenuations undergone by the pilot signal are identical to those undergone by the useful signal. In the receiving channel, as already described with reference to FIG. 1, the composite signal is applied to an amplifier followed by a digital attenuator and there is connected to this circuitry an automatic-gain-control device which processes the pilot signal isolated by it and controls the attenuator in such manner that the useful signal which it delivers, either alone or still mixed with the pilot signal, has the required level.

FIG. 2 represents a gain-control-device according to a invention connected to the output of the receiving amplifier 10. In this case, the device acts on an attenuator 16 on the downstream side thereof and the adjustment is achieved very rapidly. This device comprises a band-pass filter 11 isolating the pilot signal Sp from the composite signal Sc delivered by the amplifier 10, a rectifier 12 without threshold, transforming the pilot signal into a continuous voltage, an analog-digital converter 13 changing that voltage level into a digital word of several bits whose number depends on the required precision, a buffer register 14, and a transcoder 15. The latter is connected to the attenuator 16 whose attenuation it adjusts. A high-pass filter 8 connected to the output of the attenuator delivers the useful signal Su to the load 9. It will be noted that this high-pass circuit could also be connected to the attenuator on the upstream side thereof. The converter 13 and the buffer register 14 are controlled by a clock 17 or by a command from an external source 18, depending on the position of the switch 19.

It will be recalled that the composite signal Sc in its optical form impinges on the photodiode 1 which emits a volage proportional thereto at the terminals of the resistor 2. This signal voltage is amplified in the fixed-gain amplifier 10. The signal Sc is represented in FIG. 4.1, the pilot signal Sp being a sinusoidal component thereof. The band-pass filter 11 isolates the pilot signal Sp, FIG. 4.2, from the composite signal. The rectifier 12, without threshold, connected to the circuit 11 produces a resulting continuous voltage of value v (FIG. 4.3) applied to the analog-digital converter 13 which transforms it into a multibit digital word. The digitization of the pilot signal is controlled by a clock pulse $H_1$ (FIG. 4.4) coming either from external source 18 or from internal clock 17. One or the other of these possibilities is realized by actuating the switch 19. FIG. 4.5 shows diagrammatically the state of the output conductors of the converter on which the constituent bits of the word appear after a time tc during which the analog signal is converted into its digital equivalent. A vertical line $V_1$ (FIGS. 4.6 and 4.7) marks the end of the operation of the analog-digital conversion. A clock signal $H_2$ (FIG. 4.6) then causes the inscription of the digital word representing the pilot signal in the buffer register 14. This buffer register may be formed by bistable multivibrators or flip-flops which are or are not set, depending on the voltage levels existing on the outputs of the analog-digital converter 13. The transcoder 15 connected to the buffer register transforms the word corresponding to the pilot signal into a code compatible with the control of the digital attenuator 16. The transcoding circuit is advantageously constituted by a suitably programmed read-only memory (ROM) addressable by the digital value of the pilot signal to read out binary words representing the logical states of the attenuator control. A vertical line $V_2$ marks the loading of the buffer register.

The attenuator 16 comprises a plurality of attenuating networks whose number depends on the signals to be treated. Each network has an attenuation or step-down factor of predetermined magnitude, e.g. in decibels. In particular, we prefer to provide step-down factors conforming to a geometric progression. An attenuator with five networks would have, for example, one network of 8 dB, one of 4 dB, one of 2 dB, one of 1 dB, and one of 0.5 dB.

An advantageous attenuating network, switchable with the aid of a single control member by a binary command Cd, is shown diagrammatically in FIG. 5.

In this Figure, the attenuating network is a T network formed by three resistors $R_1$, $R_2$, $R_3$ controlled by a relay having two contacts $C_1$ and $C_2$. The network, however, could also be of $\pi$ shape.

The contact $C_1$ is a make contact whereas the contact $C_2$ is a break contact. In the absence of a command, when the binary level is "0", the contact $C_2$ remains closed and the contact $C_1$ is open. The attenuating network is out of action and the attenuation between its input E and its output S is zero, the resistance relative to ground being infinite.

When the command Cd is at the logic level "1", the make contact $C_1$ is closed whereas the break contact $C_2$ is open; the network is operative and the signal issuing from the network at its output S has a predetermined attenuation relative to the signal at the input E.

FIG. 6 shows attenuating circuitry which is slightly different from the preceding one with the contacts of the relay arranged in a different way, enabling the connection of several attenuating networks in series.

The networks $L_1$ and $L_2$ are assumed to be identical as concerns the values given to the resistors of which they are composed. However, it will be obvious that these values may be different. The contacts $C_{10}$, $C_{11}$, $C_{20}$, $C_{21}$ are so disposed that, whatever their positions which activate or deactivate the corresponding networks, a signal may pass therethrough while undergoing or not undergoing the corresponding attenuation. The positions of the contacts represented in the Figure indicate that the network $L_1$ is deactivated (i.e. short-circuited) whereas the network $L_2$ is activated.

It is also possible to employ a single T attenuator switched on the same principle as networks $L_1$ and $L_2$, or to combine several networks adapted to be cut in according to some binary code, as, for example, to provide an attenuation of 0 to 10 dB in steps of 1 dB with four networks of step-down factors 4 dB, 3 dB, 2 dB, 1 dB in series.

It will be observed that these attenuators are switched by means of relays, constant attenuations for frequencies ranging from d-c to the region of gigahertz can be readily obtained.

The adjustment of the attenuator control is easily explained.

It may be assumed that the pilot signal arrives normally at a level $V_{max}$. The attenuator is then adjusted to give a maximum of attenuation.

At the output there consequently exists $V_{max} \cdot K_{max}$, where $K_{max}$ is the maximum-attenuation coefficient.

If, after degradation in the optical connection, the voltage received changes from $V_{max}$ to a voltage $V_{max} \cdot K_1$, where $K_1$ is some attenuation factor taken by way of example, the attenuator is placed in a position corresponding to a complementary step-down factor $K_2$ which is such that there is obtained at its output a pilot amplitude $V_{max} \cdot K_1 K_2$ which substantially equals $V_{max} \cdot K_{max}$ to within one quantization step. At the output of the attenuator, whatever be the overall attenuation which guarantees the maintenance of the scale for the useful signal Su, the latter, after separation in the high-pass filter 8, appears at the input terminal of load 9.

It was mentioned hereinbefore that the analog-digital converter 13 must have a certain degree of precision. In fact, the converter must have sufficient resolution to permit ascertaining the weakest variations of the continuous voltage corresponding to a gain variation equal to the chosen quantization step.

If the analog-digital converter is linear, it must be possible to ascertain the variation of continuous voltage between the allowed maximum attenuation and that decreased by the chosen quantization step.

By way of example, if it is desired to correct an attenuation which may vary between 0 and 16 dB with a quantization step of 0.5 dB, it is necessary to ascertain the variation of continuous voltage resulting from an attenuation variation of 16 dB to 16 dB−0.5 dB=15.5 dB, thus in percentage:

$$100(10^{-15.5/20} - 10^{-16/20}) = 0.939\%$$

of the maximum voltage, corresponding to an attenuation of 0 dB. There must be envisaged for the foregoing example an analog-digital converter of seven bits giving a resolution of 0.79% of the full scale.

FIG. 3 represents a device according to the invention in which the pilot oscillation is extracted from the output of the attenuator 16.

Whereas the device shown in FIG. 2 acts rapidly on the attenuator located on the downstream side, the device shown in FIG. 3 constitutes a negative-feedback loop which eliminates the errors due to the lack of precision of the digitally controlled attenuation, at the price of a slight loss of speed.

However, it must be noted that the gain-control device in this case does not essentially differ from that shown in FIG. 2.

It comprises, in fact, circuits which can be found in the device shown in FIG. 2 and which consequently carry the same references. The device therefore comprises, at the output of the attenuator 16, a band-pass filter 11 isolating the pilot signal Sp from the composite signal Sc, a rectifier 12, an analog-digital converter 13 followed by a buffer stage 14, and a transcoder 15. However, in the case of FIG. 3, the transcoder acts on the attenuator not directly but through a memory 21 that stores the preceding state of the attenuator which must be taken into account in a subsequent clock cycle. The operation of this device is not significantly different from that of FIG. 2. The presence of the memory 21 registering the preceding state of the attenuator is justified by the fact that, as the pilot signal is taken off after it has passed through the attenuator, it has undergone therein a further attenuation which is added to that undergone in the optical connection.

It will be noted that in the case of this Figure, just as in the case of FIG. 2, the converting circuit 13 and the buffer register 14 are controlled by clock pulses marked $H_1$, $H_2$; memory 21 responds to clock pulses $H_3$ in order to preserve the setting of attenuator 16 to the next clock cycle for the reason discussed above.

We claim:
1. A device for automatically controlling the gain of a receiving channel carrying high-frequency message signals from a transmission path to a load, said message signals being subjected to varying degrees of attenuation in passing over said transmission path and being accompanied by a pilot oscillation of predetermined frequency having a constant amplitude level at the point of origin, comprising:
   digitally settable attenuation means in said receiving channel;
   filter means connected to said receiving channel for extracting said pilot oscillation therefrom;
   rectifying means connected to said filter means for producing a continuous voltage of a magnitude varying with the amplitude of the received pilot oscillation;
   an analog/digital converter connected to said rectifying means for translating the magnitude of said voltage into bit combinations; and
   transcoding means including a read-only memory connected to said analog/digital converter for emitting predetermined binary words in response to being addressed by said bit combinations, said binary words being fed to a control input of said attenuation means for establishing therein a step-down factor complementing the degree of attenuation experienced on said transmission path.

2. A device as defined in claim 1 wherein said receiving channel further includes an amplifier in series with said attenuation means.

3. A device as defined in claim 1 or 2 wherein said attenuation means comprises a plurality of cascaded resistance pads and switch means for selectively short-circuiting any of said resistance pads in response to said binary words.

4. A device as defined in claim 1 or 2, further comprising a buffer register inserted between said analog/digital converter and said transcoding means for temporarily storing said bit combinations, and a source of clock pulses stepping said analog/digital converter and said buffer register.

5. A device as defined in claim 4 wherein said filter means is connected to said receiving channel at a point downstream of said attenuation means, further comprising a memory inserted between said transcoding means and the control input of said attenuation means, said memory being controlled by said source for preserving the setting assumed by said attenuation means in a previous cycle of said clock pulses.

* * * * *